United States Patent [19]

Lewis et al.

[11] 4,139,859
[45] Feb. 13, 1979

[54] SEMICONDUCTOR DEVICE PACKAGE

[75] Inventors: Terrence E. Lewis, San Diego; Kenneth N. Abel, Vista, both of Calif.

[73] Assignee: Burroughs Corporation, Detroit, Mich.

[21] Appl. No.: 741,747

[22] Filed: Nov. 15, 1976

Related U.S. Application Data

[62] Division of Ser. No. 591,286, Jun. 30, 1975, Pat. No. 3,999,285.

[51] Int. Cl.² ........................................... H01L 23/28
[52] U.S. Cl. ...................................... 357/72; 357/70; 357/74; 357/81
[58] Field of Search ....................... 357/70, 72, 74, 81

[56] References Cited

U.S. PATENT DOCUMENTS

| | | | |
|---|---|---|---|
| 3,909,838 | 9/1975 | Beyerlein | 357/72 |
| 3,943,623 | 3/1976 | Mizutani et al. | 357/80 |

Primary Examiner—Edward J. Wojciechowicz
Attorney, Agent, or Firm—Mervyn L. Young; Kevin R. Peterson

[57] ABSTRACT

A semiconductor device package and a method of making it. A woven fiber mat impregnated with an epoxy adhesive serves as a first housing member. It includes an opening therein for receiving a semiconductor device. The housing member is placed on a supporting heat sink and a lead frame placed on top of the housing member. This subassembly is heated to bond the elements together by curing the epoxy adhesive in the first housing member. A similar second housing member is then placed over the lead frame. The second housing member includes an opening therein which is slightly larger than the opening in the first housing member. A lid is placed on top of the second housing member to cover the opening after the semiconductor device has been bonded to the substrate within the openings in the housing members. The assembly is then again heated to bond the remaining elements together with the epoxy adhesive in the second housing member to form a completed package.

5 Claims, 5 Drawing Figures

SEMICONDUCTOR DEVICE PACKAGE

This is a division, of application Ser. No. 591,286, filed June 30, 1975, now U.S. Pat. No. 3,999,285.

BACKGROUND OF THE INVENTION

This invention relates to semiconductor devices. More particularly, it relates to a power semiconductor device package and a method of making it.

It is well recognized that heat must be readily dissipated from a semiconductor device in order to ensure proper performance. This is especially true when the semiconductor device is a power device generally defined as those devices which dissipate one watt of power or more. It has been recognized that one method of removing the heat from the device is to include a heat sink in the package which houses the device.

Various methods have been employed to bond the semiconductor device to the heat sink. In one package design, the semiconductor device is bonded to a ceramic substrate, with the substrate in turn bonded to a metallic heat sink. Unfortunately, this intermediate ceramic substrate impedes heat dissipation for the device. Consequently, the heat generated in the device is not efficiently removed.

One of the other disadvantages of some of the commercially available packages is that they require relatively high temperatures in order to assemble the finished package. Some of these packages require a temperature of about 450° F in order to assemble the package. Such high temperatures can degrade the performance of the semiconductor devices. This is especially true of MOS (metal-oxide-semiconductor) devices.

In most aplications, it is imperative that the package provide a good hermetic seal to protect the device from adverse environmental conditions. The prior art has heretofore provided such hermetically sealed packages only at the expense of additional cost in materials and labor.

It would be advantageous to provide a semiconductor device package which is low in cost and which can be easily assembled at temperatures which will not degrade device performance, while still providing excellent heat dissipation and hermeticity.

OBJECT AND SUMMARY OF THE INVENTION

It is, therefore, the primary object of this invention to provide a semiconductor device package and a method of making it, wherein the package is low in cost and which can be assembled at temperatures which will not degrade device performance, yet still provides excellent heat dissipation and a hermetically sealed enclosure for the semiconductor device.

Briefly, this invention accomplishes this and other objects by utilizing housing members made of a woven fiber mat which is impregnated throughout with a thermosetting epoxy resin adhesive. Preferably, the epoxy adhesive has a volatile content of no more than 0.5% parts by weight to insure good hermeticity. The housing members have been precut to the desired shape and includes an opening therein for receiving a semiconductor device. A first housing member is placed on a substrate, preferably a metallic heat sink, and a lead frame placed on top of it. The lead frame includes a plurality of convergent finger members which terminate at the opening in the first housing member. This subassembly is heated at relatively low temperatures to bond the elements together with the epoxy adhesive already in the first housing member. A semiconductor device can then be mounted directly on the substrate within the opening in the housing member. The semiconductor device is then interconnected with inner portions of lead frame finger members, as by filamentary wire leads. A similar second housing member is placed on top of the lead frame. The second housing member has a larger corresponding opening therein which leaves the inner portions of the lead frame finger members exposed. A lid is placed on top of the second housing member and covers the opening therein. The assembly is then again heated to simultaneously bond the second housing member to the lead frame and the lid to the housing member with the epoxy adhesive in the second housing member.

DESCRIPTION OF THE PREFERRED EMBODIMENT

Figure 1:
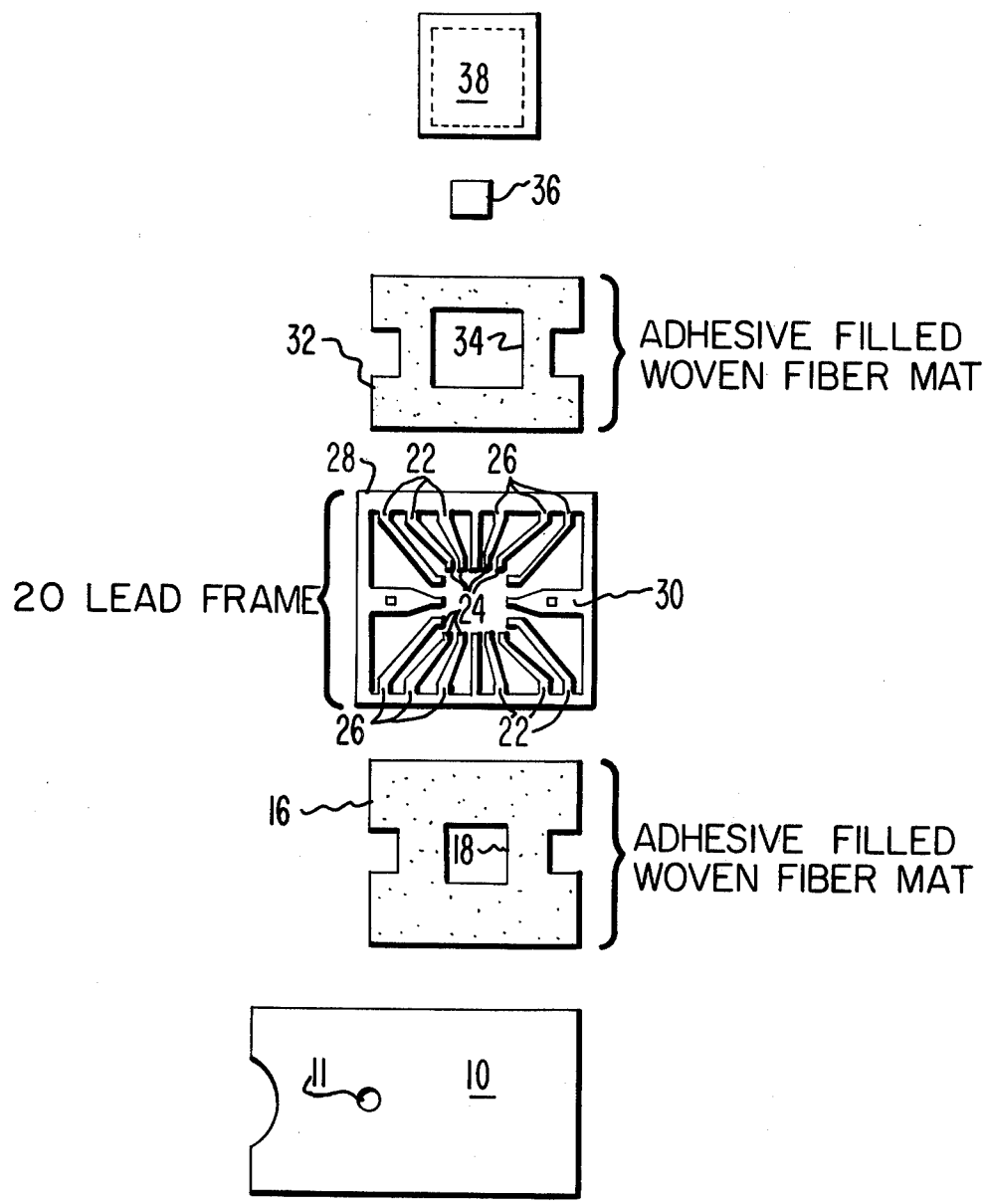
FIG. 1 is an exploded top plan view of the elements of one embodiment of the semiconductor device package of this invention.

Referring now to the drawings, a base member 10 has two flat major parallel surfaces 12 and 14. Base member 10 serves as a heat sink member and is preferably made of copper. Other materials can be used for the base member 10 such as aluminum and suitable copper alloys. In this embodiment base member 10 includes an aperture 11 for alignment purposes in an external connector (not shown).

Special attention is drawn to housing member 16. Housing member 16 is a flexible preform of a woven fiber mat which is filled or impregnated throughout with an adhesive. Preferably, the preform is a mat or cloth of woven glass fibers which is impregnated and coated with an epoxy adhesive resin of the thermosetting type. This preform is non-tacky, flexible, and can be stored at room temperature for about 6 months. Housing member 16 in this preferred embodiment has a total thickness of approximately 0.009 inches. The impregnated woven fiber mat is approximately 0.005 inches thick, and has a coating of epoxy adhesive (not shown) approximately 0.002 inches thick on both its upper and lower major surfaces.

We have discovered that optimum hermeticity is acquired if the adhesive has volatile constituents, such as acetone solvent, of no more than 0.5% parts by weight in its uncured state. By limiting the volatile content to this amount, outgassing during assembly and curing of the epoxy adhesive is reduced. The outgassing of the volatile constituents may create air passages or pin holes in the housing member 16 which may degrade the hermetic seal of the package. Preferably, the adhesive is an epoxy thermosetting resin which can be cured at temperatures of 170° C. or less. As an illustrative example, the epoxy adhesive of this embodiment can be cured according to the following schedule:

1 hour at 170° C.;
2 hours at 150° C.; or
3 hours at 125° C.

The adhesive filled woven fiber mat preform for housing member 16 can be obtained in various thicknesses and sizes. It is commercially available in an uncured state as a flexible sheet from Ablestik Laboratories of Gardina, California under the trade name of "Ablefilm 550". Housing member 16 can be readily cut from this sheet into the desired dimensions. In this embodiment, the housing member is generally rectangular and has the same width as base member 10. Housing member 16 includes a centrally located opening 18 therein for receiving a semiconductor device. Opening 18 in this embodiment is a square approximately 0.2 inch on a side.

A lead frame 20 includes a plurality of spaced mutually converging finger members 22 which serve as discrete leads. Finger members 22 have inner portions 24 which terminate in a generally rectangular configuration corresponding to opening 18 in housing member 16. Lead frame 20 is preferably made of Kovar which is coated with a thin layer of gold. The lead frame can also be made of suitable copper or nickel alloys, if desired. The finger members 22 diverge outwardly from inner portions 24 and form two spaced opposed parallel rows of enlarged contact pads 26. The finger members 22 are supported by a surrounding outer frame 28. Two oppositely disposed ground straps 30 are similar to the finger members 24 except that they are somewhat wider.

Housing member 32 is made of identically the same material as housing member 16. The only difference is in its peripheral dimensions. The width of housing member 32 is smaller than the width of housing member 16. This is to leave the contact pads 26 exposed when housing member 32 is placed on the lead frame 20. Housing member 32 also has an opening 34 therein. Opening 34 generally corresponds with opening 18. However, opening 34 is slightly larger than opening 18. In this embodiment, opening 34 is a square approximately 0.3 inch on a side. As will become evident later in this description, this is to leave the lead frame finger member inner portions 24 exposed so as not to interfere with the electrical connection to the device 36.

The semiconductor device 36 can be any integrated circuit chip known in the art, such as a silicon MOS chip. Device 36 includes a plurality of metallization areas (not shown) on the top surface thereof for making electrical connections to various regions of the device 36 as is well known in the art. A lid 38 is provided for covering the opening 34 in housing member 32. The lid is preferably made of ceramic and includes a downwardly extending lip portion on its periphery to space the lid from the device 36 and its electrical interconnections.

According to the method of our invention, housing member 16 is placed on surface 12 of base member 10. The lead frame 20 is placed on the upper surface of housing member 16 so that the inner portions 24 of the lead frame fingers 22 terminate at the opening 18 in the housing member 16. This subassembly is then heated at about 170° C. in ambient air for about one hour by placing it in a preheated oven. Any suitable industrial oven used in semiconductor technology may be used. We have found it desirable to add approximately 5 psi of pressure to the elements during this heating process. This may be accomplished simply by laying a thick sheet of plate glass on top of lead frame 20 and placing the appropriate amount of weight thereon. During this heating step the epoxy resin sets and develops a bonding force so that it can be used as an adhesive agent. This is referred to as curing the epoxy. In such manner, housing member 16 is permanently bonded to the base member 10 and, simultaneously, the lead frame 20 is bonded to the upper surface of the housing member 16. No additional step is required to add a bonding agent since the adhesive has already been pre-impregnated into the housing member 16. After this first curing step, the outer frame 28 is severed from the lead frame using well known techniques, thereby leaving the finger members 22 and the ground straps 30 as discrete leads bonded to the upper surface of housing member 16.

The next step is to bond the semiconductor device 36 to the base member surface 12 within the confines of opening 18 in housing member 16. If it is desired that device 36 be electrically insulated from base member 10, a dielectric epoxy layer 37 is preferably used. A dielectric epoxy is an epoxy thermosetting resin adhesive similar to that impregnated in housing members 16 and 32, except that it is filled with fine grained powders of an electrically insulating material such as $Al_2O_3$ (alumina), $M_gO$ (magnesia), or BeO (beryllia). These filler materials provide excellent thermal conductivity for epoxy layer 37. The device 36 is bonded by curing the epoxy at about 150° C for approximately 2 hours. A commercially available dielectric epoxy can be that such as distributed by Ablestik Laboratories under the trade name "Abletherm 8-2". If desired, the chip can be electrically connected to the base member 10. This can be accomplished using a similar epoxy adhesive except that the filler materials are electrically conductive, such as gold, silver, or copper.

After the device 36 has been bonded to the base member 10, the various metallization regions on the top surface of the device 36 are bonded to their respective inner portions 24 of the lead frame finger members 22. Filamentary wire leads 40 serve as this interconnection. This can be accomplished by known ultrasonic or thermocompression bonding techniques.

Figure 2:
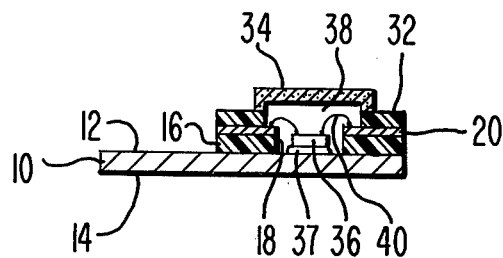
FIG. 2 is a cross sectional view of the assembled package shown in FIG. 1.
Figure 3:
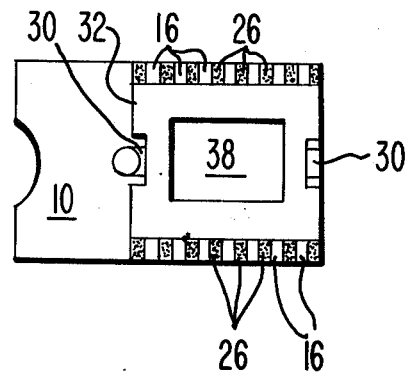
FIG. 3 is a top plan view of the package shown in FIG. 2.
Figure 4:
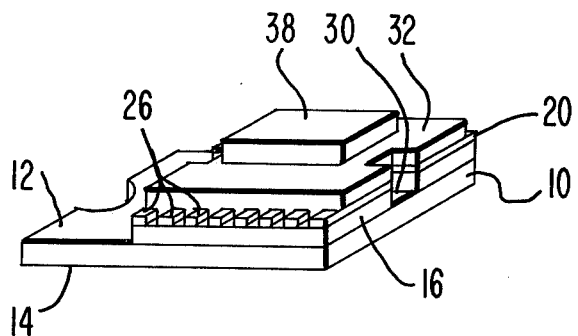
FIG. 4 is a perspective view of the package shown in FIG. 3.
Figure 5:
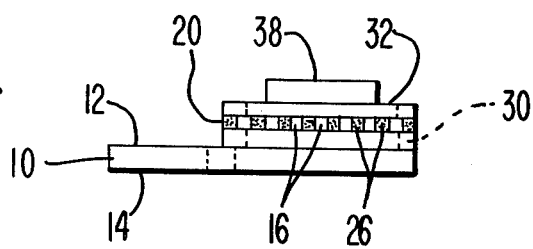
FIG. 5 is a side view of the package shown in FIG. 4.

The next step is to place housing member 32 onto the lead frame as shown most clearly in FIGS. 2–4. Housing member 32 is placed on the lead frame 20 so that the lead frame finger member inner portions 24 and the bonding pads 26 are left uncovered or exposed. The dimensions of opening 34 are such so as to not interfere with the filamentary wire 40 interconnections to the inner portions 24 of the lead frame finger members 22.

The lid 38 is then placed on top of the housing member 32 to cover the opening 34. As can be seen in FIG. 2, the thickness of the housing member 32 and the shape of the lid 38 is such that the underside of lid 38 will not interfere with the filamentary wire interconnections 40.

This assembly is heated in the same manner as the previous curing step. However, the temperature of this heating step is lower than that of the previous heating step. This is to ensure that no degradation of the early bonds occurs. Preferably, this heating step is carried out at approximately 125° C., with a pressure applied of about 2 psi, for about three hours. This heating step cures the epoxy adhesive to simultaneously bond the housing member 32 to the lead frame 20 and the lid 32 to the top surface of the housing member 32.

The epoxy adhesive in housing member 32 flows between the lead frame finger members to seal the openings therebetween during curing. The amount of flow can be readily controlled by increasing or decreasing the thickness of the epoxy coatings on the housing members. That is, the thickness of the epoxy coatings can be varied depending upon the thickness of the lead frame. It should be noted that the minimal volatile content in the epoxy adhesive prevents detrimental outgassing during these two heating and curing steps. Consequently, the package of this invention provides a surprisingly good hermetically sealed enclosure for the device 36. While the unimpregnated woven fiber mat preforms serving as housing members 16 and 32 are porous and have voids therein, they form side walls for the package which are substantially impervious to the outside gaseous environment after they have been impregnated with the epoxy adhesive and the epoxy has been cured. This is because the epoxy adhesive forms internal adhesive bonds with the fibers and fills the voids therebetween.

The final step in forming this package is to attach the ground straps 30 to surface 12 of base member 10. This can be accomplished by spot welding or stich welding techniques. Since only localized heating occurs for a short time, no degradation of the device or bonds result.

It should be noted that this package may be shipped as a subassembly to a semiconductor device manufacturer who would subsequently bond the device 36 to the base member 10, make the filamentary wire 40 interconnections, and then bond the lid 38 to the housing member 32. In such case only the second housing member 32 will be bonded to the lead frame 20 in the second heating step. This will produce a subassembly which may be shipped to the manufacturer for further assembly as described herein.

It can now be realized that the package as just described provides a relatively simple construction which has but a few discrete parts which can be assembled using known techniques. Even more importantly, it can be assembled at relatively low temperatures of approximately 170° C. or less. Therefore, no degradation of device characteristics occurs during assembly. The use of the adhesive impregnated woven fiber mat preform also is extremely advantageous. The preform serves as a major portion of the housing inasmuch as it provides much of the enclosure for the semiconductor device 36. Furthermore, since the adhesive is alread impregnated into the preform, no additional steps are required during assembly. The preform is easily handled and can be cut into various shapes as desired. Furthermore, the package provides extremely good heat dissipation since the semiconductor device is bonded directly to the heat sink. The epoxy adhesives used for layer 37, and in housing members 16 and 32 can all be cured at a variety of times and temperature as curing time is dependent upon temperature, i. e., if the temperature is lower than 170° C. the time for curing increases as is well known in this technology. Therefore, it should be understood that while this invention was described by reference to one particular example thereof, it is not intended to limit the true scope of this invention except as defined in the following claims.

What is claimed is:

1. A semiconductor device package comprising:
   a substrate having a major surface;
   a first layer of a woven fiber mat serving as a first housing member, said fiber mat being impregnated throughout with a cured thermosetting epoxy resin adhesive, said housing member having an opening therein for receiving a semiconductor device, said housing member being bonded to said substrate surface by the epoxy adhesive within the housing member;
   a plurality of spaced mutually convergent electrically conductive lead frame finger members, said lead frame finger members being bonded to said first housing member by the epoxy adhesive therein, with inner portions of the finger members teerminating at said opening;
   a second layer of a woven fiber mat serving as a second housing member, said second woven fiber mat layer being impregnated throughout with a cured thermosetting epoxy resin adhesive, said second housing member having an opening therein corresponding to yet larger than the opening in the first housing member, said second housing member being bonded to the lead frame finger members by the epoxy adhesive within said second housing member, said opening in said second housing member being aligned with the corresponding opening in the first housing member and leaving the inner portions of said lead frame finger members exposed thereby permitting a semiconductor device to be bonded to said substrate within the confines of said opening and selected portions of the device to be bonded to the inner portions of the lead frame finger members;
   a lid for covering the opening in said second housing member, said lid being bonded to the second housing member by the epoxy adhesive therein; and
   said epoxy adhesive filling voids in the fiber mat of the first and second housing members whereby said package provides an hermetically sealed enclosure for the semiconductor device.

2. The semiconductor device package of claim 1 wherein the thermosetting epoxy resin adhesive in said first and second housing members has a volatile content of less than 0.5% parts by weight in its uncured state.

3. The semiconductor device package of claim 2 wherein the first and second housing members each include an additional coating of the thermosetting epoxy resin adhesive on upper and lower surfaces thereof.

4. The semiconductor device package of claim 1 wherein said substrate is a metallic heat sink member.

5. The semiconductor device package of claim 4 which further comprises a semiconductor device bonded to said heat sink member within said openings in said first and second housing members, said semiconductor device being bonded thereto with a layer of dielectric thermosetting epoxy resin adhesive.

* * * * *